United States Patent
Thurmaier

(10) Patent No.: US 7,382,145 B2
(45) Date of Patent: Jun. 3, 2008

(54) DOCKING DEVICE ACTUATED BY PRESSURE MEANS

(76) Inventor: Stefan Thurmaier, Schwarzenbergstrasse 10, Bad Aibling (DE) 83043

( * ) Notice: Subject to any disclaimer, the term of this patent is extended or adjusted under 35 U.S.C. 154(b) by 22 days.

(21) Appl. No.: 11/492,198

(22) Filed: Jul. 25, 2006

(65) Prior Publication Data

US 2007/0030018 A1    Feb. 8, 2007

(30) Foreign Application Priority Data

Aug. 4, 2005    (DE) ...................... 10 2005 036 808

(51) Int. Cl.
*G01R 31/02* (2006.01)
(52) U.S. Cl. ...................... 324/758; 369/309
(58) Field of Classification Search ...................... None
See application file for complete search history.

(56) References Cited

U.S. PATENT DOCUMENTS

| | | | | |
|---|---|---|---|---|
| 5,961,261 A * | 10/1999 | Stark | ...................... | 409/219 |
| 6,069,415 A * | 5/2000 | Little et al. | ...................... | 307/326 |
| 6,161,826 A * | 12/2000 | Forrer | ...................... | 269/309 |
| 6,367,814 B1 * | 4/2002 | Luscher et al. | ...................... | 279/2.09 |
| 6,530,568 B2 * | 3/2003 | Etter | ...................... | 269/309 |
| 6,532,861 B2 * | 3/2003 | Etter | ...................... | 92/86 |
| 6,598,713 B1 * | 7/2003 | Kawakami | ...................... | 188/67 |
| 6,641,128 B2 * | 11/2003 | Fries | ...................... | 269/309 |
| 6,799,758 B2 * | 10/2004 | Fries | ...................... | 269/309 |
| 6,955,347 B2 * | 10/2005 | Kawakami et al. | ...................... | 269/309 |
| 2006/0186591 A1 * | 8/2006 | Yonezawa et al. | ...................... | 269/309 |
| 2007/0158891 A1 * | 7/2007 | Stark | ...................... | 269/309 |

FOREIGN PATENT DOCUMENTS

| | | |
|---|---|---|
| DE | 691 25 163 | 6/1997 |
| DE | 298 23 568 U1 | 9/1999 |
| DE | 198 29 955 A1 | 1/2000 |
| DE | 199 17 005 C1 | 10/2000 |
| DE | 102 16 003 A1 | 11/2003 |
| EP | 1 344 599 A1 | 9/2003 |

* cited by examiner

*Primary Examiner*—Ha Tran Nguyen
*Assistant Examiner*—Richard Isla-Rodas
(74) *Attorney, Agent, or Firm*—Nixon & Vanderhye P.C.

(57) ABSTRACT

With a docking device for the coupling of a handler or prober to a test head for electronic components, at least one locking unit is provided, which has an axially displaceable ball element clamping sleeve. This ball element clamping sleeve is surrounded by an annular pressure chamber, closing pressure-tight opposite the introduction area of the locking pin and can be moved in an axial direction by means of a ring piston, which can be actuated by a pressure means introduced into the pressure chamber.

4 Claims, 3 Drawing Sheets

DOCKING DEVICE ACTUATED BY PRESSURE MEANS

BACKGROUND OF THE INVENTION

The invention relates to a docking device for the coupling of a first device including a handler or prober with a second device including a test head for electronic components.

To test electronic components such as, for example, integrated circuits (IC), the principle is known of using a testing device with a test head, which must be connected to a handling device for the electronic components, such as a handler or prober. In order to allow for the docking of the test head, which may weigh up to 1,000 kg, to the handling device in the simplest, easiest, and most precise way possible, special docking devices, i.e. coupling devices, have been developed, which on the one hand are secured to the handling device and, on the other hand, to the test head. A disadvantage with such known docking devices, however, is the fact that the docking of the test head using these docking devices is not always possible in the simple, easy, and precise manner desired, and, in addition, they are frequently expensive or complex in their structure.

From DE 102 16 003 A1, a docking device is known, which avoids the disadvantages referred to above by means of a ball element clamping sleeve, which is arranged torsionally-resistant but displaceable in its axial direction inside the locking unit, and can be moved in the axial direction in the manner of a spindle by means of a threaded sleeve surrounding the ball element clamping sleeve. The rotation of the threaded sleeve is effected by means of a draw cable device. Although this known docking device already has perceptible advantages over other known devices, it nevertheless requires improvement with regard to its handling.

SUMMARY OF THE INVENTION

The invention is based on the object of providing a docking device, which allows for a particularly simple, easy, and precise coupling of the handling device to the test head.

With the docking device according to the invention, the ball element clamping sleeve is surrounded by an annular pressure chamber, closing pressure-tight opposite the introduction area of the locking pin, and can be moved in an axial direction by means of a ring piston, which can be actuated by a pressure means introduced into the pressure chamber.

With the aid of the docking device according to the invention, an easy, simple, and precise coupling of the handling device to the test head is possible, since it can be carried out in an automated manner by a pressure means, in particular pneumatic. In comparison with a mechanical actuation of the locking unit, actuation with the support of a pressure means has the further advantage that it can be carried out very rapidly and with low wear. In addition to this, the device can be produced in a simple and economical manner and with few parts.

According to an advantageous embodiment, the pressure chamber is delimited on one face side by a cover plate of the locking unit, and radially inwards by a sleeve element which surrounds the ball element clamping sleeve co-axially and extends away from the cover plate. In addition, the ball element clamping sleeve has a carrier flange extending radially outwards over the sleeve element, which flange is connected to the ring piston. Such an arrangement can be produced easily and economically, and ensures a perfect function over an extended period of time.

According to an advantageous embodiment, a spring means is provided on at least the side of the ring piston opposite the pressure chamber, said spring means exerting an axial spring force on the ring piston, which opposes the thrust force of the pressure means. Such spring means, which may consist, for example, of a plurality of springs arranged around the mid-axis of the locking unit, or may also consist of a single spring, makes it possible in a simple manner for a resetting force to be exerted on the ring piston, moving the piston back into its original position, when the pressure chamber is switched to be free of pressure so as to suspend the locking.

In addition, it is also possible, according to an advantageous embodiment, for a spring means to be provided in the pressure chamber, which spring means exerts an axial spring force on the ring piston. This spring means, which expediently comprises one or more pressure springs, can, on the one hand, support the effect of the pressure means during the displacement of the ring piston, and, on the other hand, in combination with the spring means arranged on the opposite side, can position the ring piston in a zero setting when the pressure means is released from the pressure chamber.

BRIEF DESCRIPTION OF THE DRAWINGS

The invention is explained in greater detail by way of example hereinafter on the basis of drawings. These show.

DETAILED DESCRIPTION OF THE INVENTION

Figure 1:
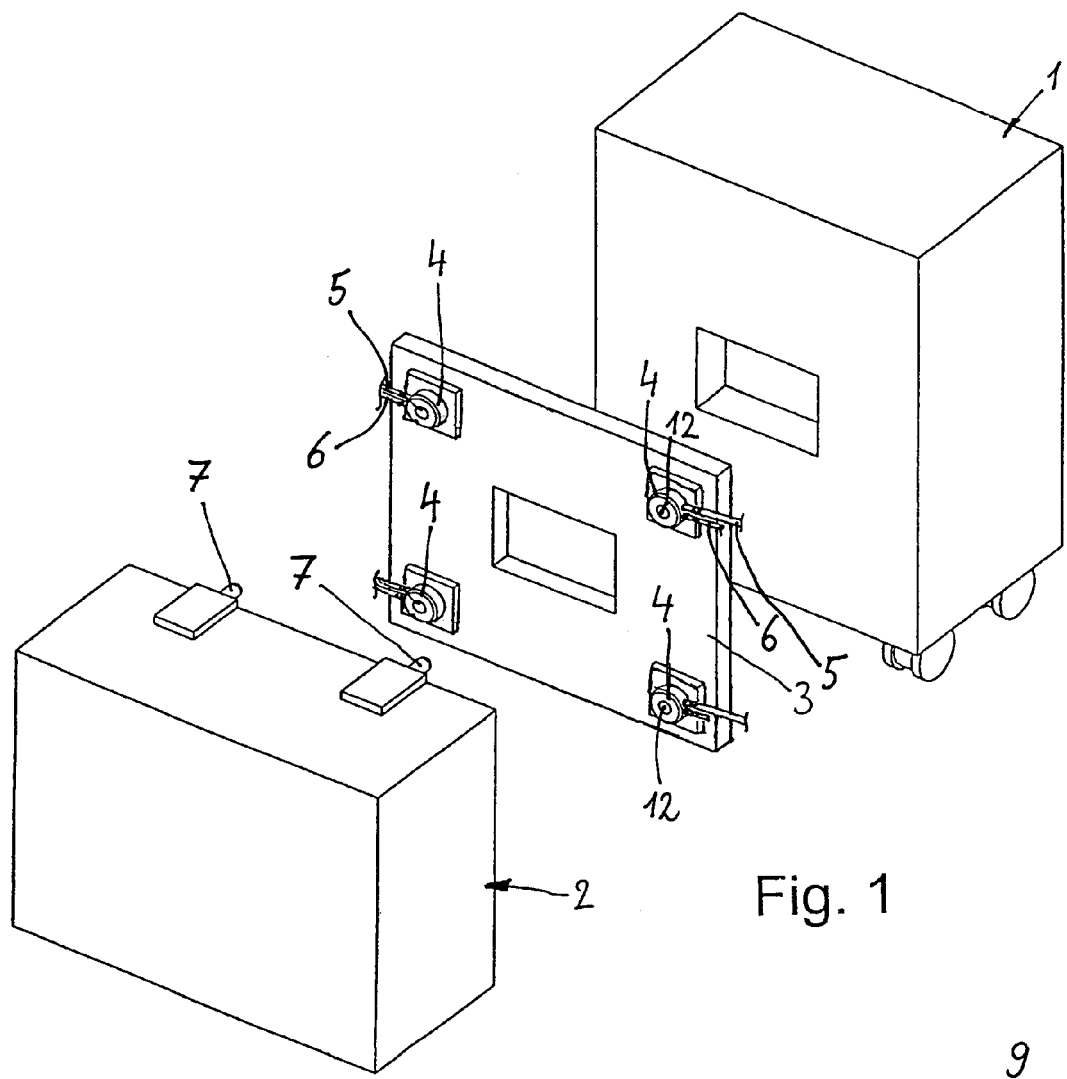
FIG. 1: A diagrammatic representation of a handling device, a test head, and a docking device for the coupling of these two devices.

FIG. 1 shows a diagrammatic representation of a handling device 1, as well as a test head 2. For docking the test head 2 to the handling device 1, a docking plate 3 is used, which can be secured either directly to the handling device 1 or to an intermediate frame, not represented, on which a total of four locking units 4 are secured, arranged in the corner areas of the docking plate 3. The locking units 4 can be actuated by a pressure means, expediently by means of compressed air, which can be introduced to the locking unit 4 via pressure media lines 5, 6, and removed from it via these lines.

Secured to the test head 2 are four locking pins 7, which project over the test head 2, and, as will be described in greater detail hereinafter, can be brought into engagement with the locking units 4.

The docking of the test head 2 to the handling device 1 takes place in such a way that, in the first instance, the test head 2 is moved onto the handling device 1 and onto the docking plate 3 sufficiently far until the locking pins 7 have been introduced into middle introduction apertures of the locking units 4, which have a centering hole 12, as a result of which the test head 2 is centered. The locking units 4 are then actuated by the introduction of a pressure means in such a way that the locking pins 7 and therefore the test head 2 are drawn further to the docking plate 3, as far as the end position, and locked there in this position.

The structure and function of the locking units 4 is explained hereinafter in greater detail on the basis of FIGS. 3 to 6. The four locking units 4 represented in FIG. 1 are identical in design.

As can be seen from FIGS. 3 to 6, each locking unit 4 has a securing plate 9, which can be screwed securely by means of screws, not shown in any greater detail, to the docking plate 3. Secured to the securing plate 9 by means of screws, not shown in any greater detail, is a housing casing 10, in an annular or sleeve shape, with a circular cross-section. The housing casing 10 is covered upwards by a circular cover plate 11, which has the middle centering hole 12. The diameter of this centering hole 12 is matched precisely to the outer diameter of the cylindrical locking pin 7, so that a close fit is achieved. As an alternative, it is also possible for the centering hole 12 to be provided in a separate centering sleeve, not represented, which is located in the cover plate 11.

Provided inside the housing of the locking unit 4, axially flush to the centering hole 12, is a ball cage 13, which serves to guide and retain a plurality of ball elements 14, which are arranged around the circumference of the ball cage 13. The ball cage 13 is essentially bowl-shaped and has a flat bottom 15 and an annular circumferential side wall 16. In the upper part of the side wall 16 is a total of eight ball inlet apertures 17 extending radially, which penetrate the side wall 16 and are arranged distributed regularly over its circumference.

The diameter of the ball inlet apertures 17 is somewhat greater at the radial outer end than that of the ball elements 14, so that the ball elements 14 can move from the outside radially inwards into the ball inlet apertures 17. At the radially inner end, the diameter of the ball inlet apertures 17 is, by contrast, somewhat less than that of the ball elements 14, as a result of which the ball elements 14 can be prevented from falling completely inwards into the cavity of the ball cage 13. The cavity of the ball cage 13 runs approximately conically downwards, and is therefore matched to the shape of the free end area of the locking pin 7.

The bottom 15 of the ball cage 13 forms a contact surface for the face side of the locking pin 7. In addition, the outer diameter of the lower section of the ball cage 13 is less than that of the upper section, so that a circumferential shoulder 18 is formed, which serves as a contact surface for a spring 19.

The spring 19 is designed as a pressure spring, and on one side lies in the shoulder 18 of the ball cage 13 and, on the other side, lies on the securing plate 9, so that it exerts a pre-tensioning force onto the ball cage 13, against the introduction direction of the locking pin 7, i.e. upwards in FIGS. 3 to 6.

The spring 19 is surrounded by a guide ring 20, which from the securing plate 9 extends upwards over only a small part of the total height as far as the cover plate 11, and serves to provide radial guidance of the spring 19 and the ball cage 13, which can dip into the guide ring 20.

The ball cage 13 and the ball elements 14 are surrounded by a ball element clamping sleeve 21, which is arranged inside the housing of the locking unit 4 and is also axially displaceable relative to the ball cage 13. The ball element clamping sleeve 21 has a central axial passage aperture with different diameters. The upper end section 24 of the passage aperture is in this situation cambered in dome fashion inwards, due to a web 22 projecting radially inwards. The upper end section 24 accordingly represents a ball element clamping section which presses the ball elements 14 radially inwards when the ball element clamping sleeve 21 is displaced relative to the ball cage 13.

In its end area opposite the web 22, the ball element clamping sleeve 21 has an annular flange 25 projecting radially, which is in contact on the lower face side of a ring piston 26 and is secured to this by screws 27, so that a movement of the ring piston 26 in the axial direction of the locking unit 4 results in a corresponding axial movement of the ball element clamping sleeve 21.

Figure 2:
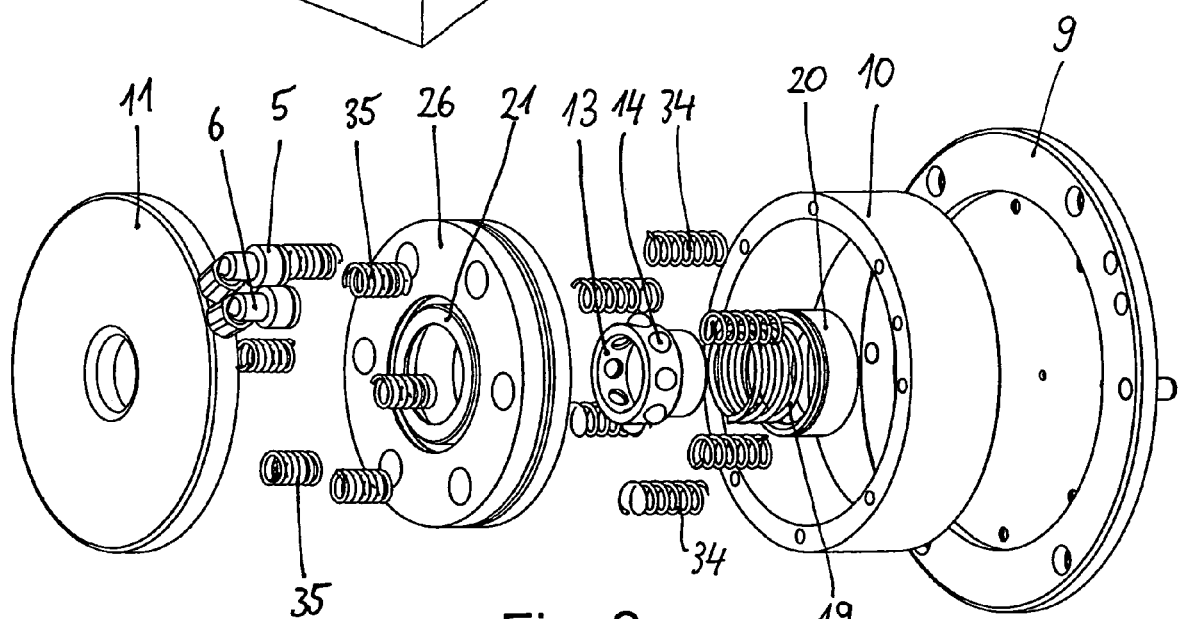
FIG. 2: A locking unit in an exploded representation.

The axial movement of the ring piston 26 is effected by a pressure means, expediently by means of compressed air, which is conducted into a pressure chamber 28 (see in particular FIGS. 5 and 6) via the pressure means line 5 (FIGS. 1, 2). The pressure chamber 28 is delimited upwards by the cover plate 11, downwards by the ring piston 26, radially outwards by the housing casing 10, and radially inwards by a tubular sleeve element 29, which is secured, for example adhesively bonded, by its upper end area to the cover plate 11, and extends between the ring piston 26 and the ball element clamping sleeve 21 in the direction of the securing plate 9. The ring piston 26 is sealed against the sleeve element 29 by means of a sealing ring 30, such as an O-ring, which is located in a corresponding circumferential groove in the inner circumferential wall of the ring piston 26. In corresponding manner, the ring piston 26 is sealed against the housing casing 10 by means of a sealing ring 31, such as an O-ring, which is located in a corresponding circumferential groove on the outer circumference of the ring piston 26.

The sleeve element 29 is about half as long as the distance between the cover plate 11 and the securing plate 9. Accordingly, a space is formed beneath the sleeve element 29, so that the flange 25 of the ball element clamping sleeve 21 extends in the radial direction outwards over the sleeve element 29 and can engage beneath the ring piston 26. On the other hand, the sleeve element 29 is long enough to ensure that, in the fully-lowered position of the ring piston 26 (FIG. 6), in which the flange 25 impinges on the bottom of the securing plate 9, the sealing ring 30 does not come out of engagement with the sleeve element 29. The pressure chamber 28 is therefore sealed pressure-tight against the introduction aperture 8 in every position of the ring piston 26.

Although the ball element clamping sleeve 21 in the embodiment shown is located with relatively little play inside the sleeve element 29, this is not absolutely necessary for the functioning of the device. Rather, the centered guidance of the ball element clamping sleeve 21 takes place on the one hand via the ring piston 26, to which the ball element clamping sleeve 21 is securely screwed, as well as via the lower guide ring 20, over which the ball element clamping sleeve 21 can be pushed in its descending movement. A sealing ring 32 located in the outer circumferential surface of the guide ring 20 can additionally provide a seal between the guide ring 20 and the ball element clamping sleeve 21, in the event that, as in the embodiment represented, the space 33 between the ring piston 26 and the securing plate 9 is designed as a pressure chamber, in order to move the ring piston 26 from its lowered position represented in FIG. 6 back into the starting position represented in FIG. 3.

This pushing of the ring piston 26 back into its starting or unlocking position is supported by a plurality of springs 34, which are supported on one side on the securing plate 9 and on the other side on the underside of the ring piston 26. In the embodiment represented, a total of six springs 34 is provided at regular intervals around the guide ring 20. As an alternative to this, it is clearly also possible for another number of springs to be provided, for example just one single large spring which surrounds the guide ring 20.

On the opposite side of the ring piston 26, namely in the area of the pressure chamber 28, there is likewise located a plurality of springs 35, which are supported on the one side on the cover plate 11 and, on the other side, on the ring piston 26, and exert an additional force in the introduction direction. In the following embodiment, in turn, six springs 35 are provided. The springs 35 extend into corresponding axial blind holes 36 of the ring piston 26 and, as a result, are guided over a substantial part of their length.

In the embodiment shown, the pressure means line 5, although not shown in any greater detail in FIGS. 3 to 6, is in fluid connection with the pressure chamber 28 and the other pressure means line 6 is in fluid connection with the chamber 33 opposite.

The docking procedure is described in greater detail hereinafter on the basis of FIGS. 3 to 6.

Figure 3:
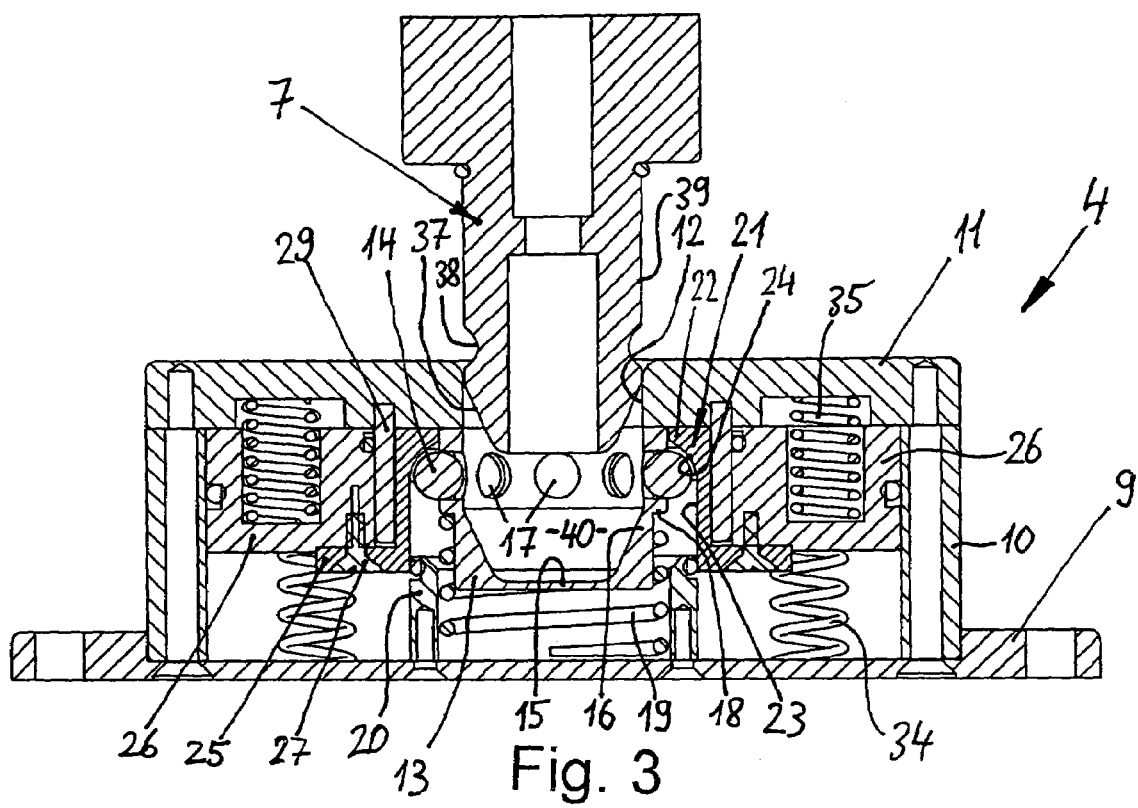
FIG. 3: A section through a locking unit, wherein a locking pin is represented at the beginning of the introduction procedure.

In FIG. 3, the beginning of the inlet of the locking pin 7 into the centering hole 12 of the cover plate 11 is shown. In order to facilitate the introduction of the locking pin 7, it has a conically tapering end area 37. Connecting to this conical end area 37 is a circumferential groove 38. Connecting in turn to the circumferential groove 38 is a cylindrical centering section 39.

In the embodiment shown in FIG. 3, the ball element clamping sleeve 21 and the ring piston 26 are located in their uppermost position, in which they are in contact with the cover plate 11. In this position, the ball elements 14 have sufficient radial play outwards to pass completely outside the cavity 40 of the ball cage 13. Because of the pressure force of the spring 19, the ball cage 13 is in its uppermost position, in which it is in contact with the cover plate 11. In the position shown in FIG. 3, the conical end area 37 of the locking pin 7 only interacts with the centering hole 12 in such a way that a certain pre-centering of the locking pin 7, and therefore of the test head 2, takes place.

Figure 4:
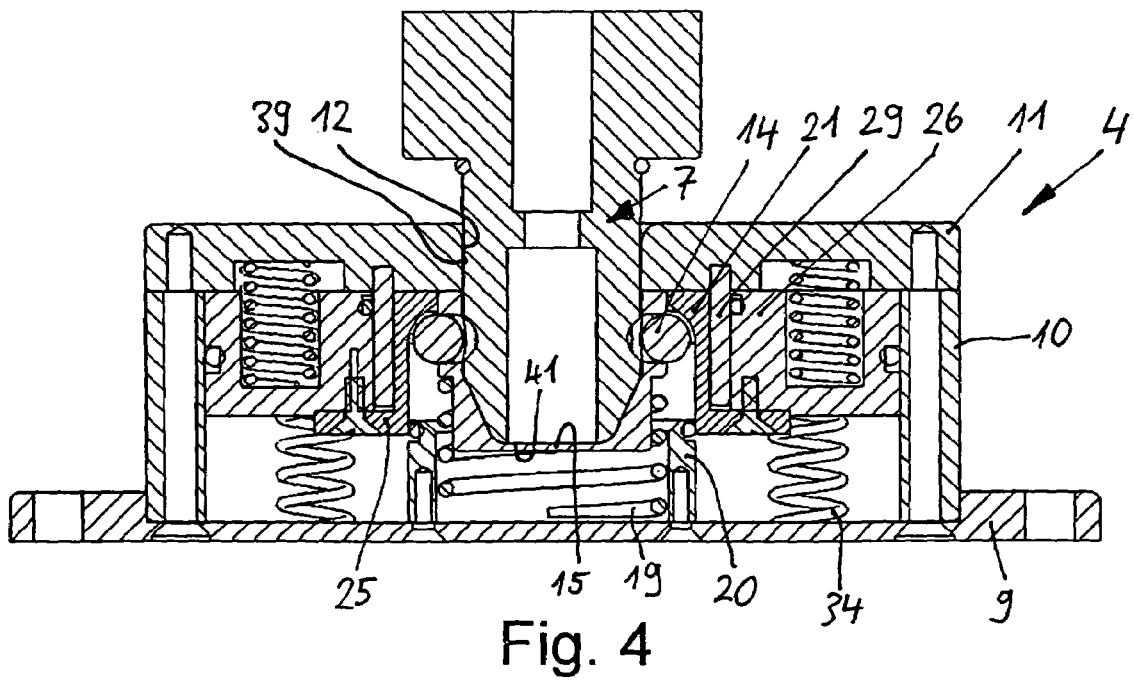
FIG. 4: The locking unit from FIG. 3 in a second position, wherein the locking pin is somewhat further introduced.

In FIG. 4 an intermediate position is shown, in which the locking pin 7 has already been introduced into the locking unit 4 sufficiently far that the centering section 39 of the locking pin 7 is located in the centering hole 12 and the centering of the test head 2 is therefore guaranteed. In addition, in this position the face surface 41 of the locking pin 7 is in contact with the bottom 15 of the ball cage 13. In this position the circumferential groove 38 of the locking pin 7 is at the same height as the ball inlet apertures 17, so that the ball elements 14 are moved radially inwards and can enter into the circumferential groove 38. However, because in the position shown in FIG. 4 the ball element clamping sleeve 21 has not yet been displaced, in this position no radial force directed inwards is yet exerted on the ball elements 14.

Figure 5:
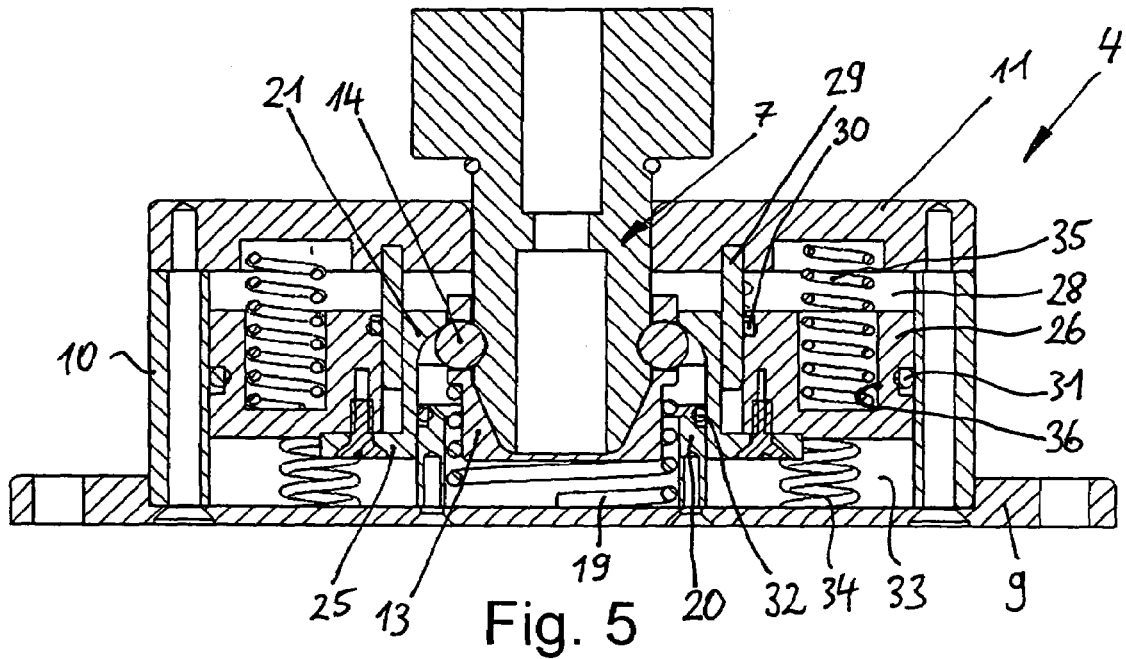
FIG. 5: The locking unit from FIG. 3 in a third position, wherein the ring piston has already been somewhat introduced so as to lock the locking pin.

If next, as can be seen from FIG. 5, a pressure means is introduced into the pressure chamber 28 via the pressure means line 5, the ring piston 26 will be moved away from the cover plate 11 and in the process carry the ball element clamping sleeve 21 with it over the flange 25. If the ball element clamping sleeve 21 is moved in the axial direction further downwards than the ball cage 13, and as a result incurs a relative movement between these two parts, the ball elements 14 are pressed by the dome-shaped end section 24 of the ball element clamping sleeve 21 radially inwards. In this intermediate position the locking pin 7 is already somewhat axially secured by the ball elements 14, so that it clearly can no longer be drawn out of the introduction aperture 8 without further ado. At the same time, however, there is also a certain flexibility present in the axial direction, since the locking pin 7 and with it the test head 2 can also be displaced further in the introduction direction, wherein the ball cage 13 moves independently of the ball element clamping sleeve 21 against the force of the spring 19 in the direction of the securing plate 9.

Figure 6:
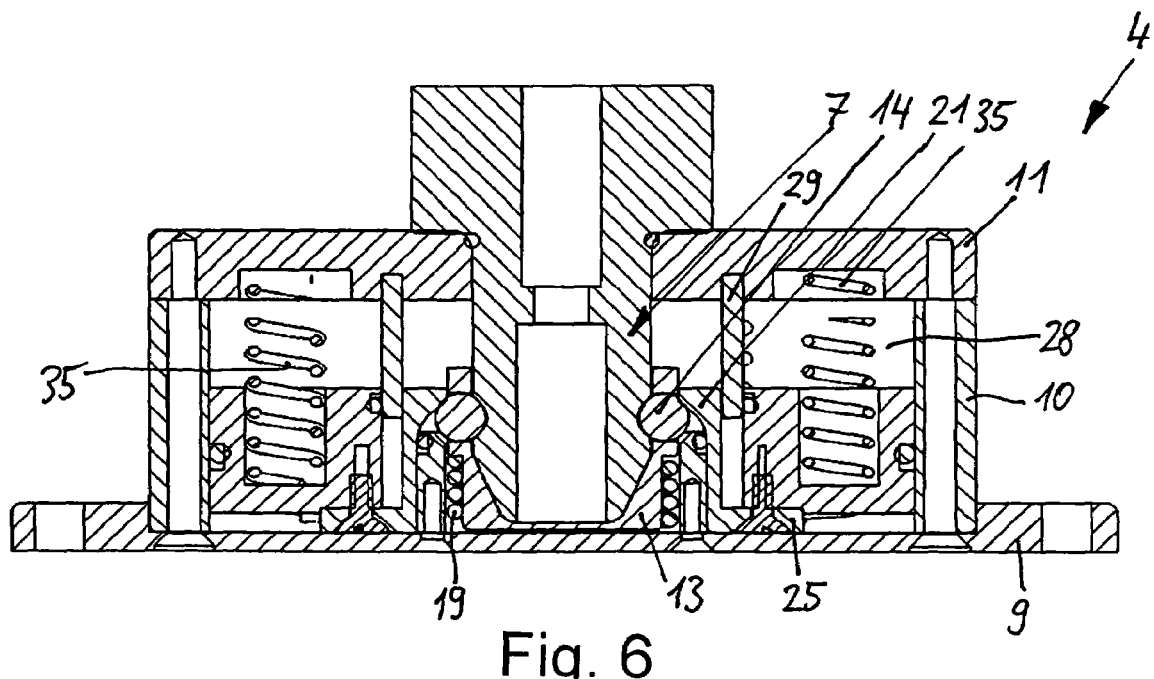
FIG. 6: The locking unit from FIG. 3 in a fourth position, which corresponds to the end locking position.

FIG. 6 shows the complete drawing in and locking of the locking pin 7. This takes place by the ring piston 26 being displaced downwards, by the introduction of pressure means into the pressure chamber 28, sufficiently far until the flange 25 of the ball element clamping sleeve 21 comes in contact with the bottom of the securing plate 9. During the axial movement of the ball element clamping sleeve 21 from the position shown in FIG. 5 into the position shown in FIG. 6, the ball elements 14 are carried with it in the axial direction and are simultaneously pressed by the dome-shaped end section 24 radially inwards into the circumferential groove 38 of the locking pin 7. By means of the ball elements 14, therefore, both the ball cage 13 and the locking pin 7 are moved in sympathy in the axial direction. In the locking position shown in FIG. 6, the ball cage 13 is also in contact with the securing plate 9. The locking pin 7 and therefore the test head 7 are both centered and locked axially.

In order to release the locking pin 7 from the locking unit 4 again, pressure means is introduced via the pressure means line 6 into the chamber 33 and the pressure means is drained from the pressure chamber 28. As a result, the ring piston 26 moves together with the ball element clamping sleeve 21 in the direction of the cover plate 11 again. This movement is supported by the effect of the springs 34. As a result, sufficient radial movement space towards the outside is created for the ball elements 14, so that the ball elements 14 can pass out of the circumferential groove 38 and release the locking pin 7.

As an alternative to the method described heretofore, another method is possible for locking a test head to a handling device. It is possible, for example, for the springs 34, 35, arranged on both sides of the ring piston 26 and taking effect on the ring piston 26 from different sides, to be designed and arranged in such a way that, with the device in the pressure-less state, ie. when no pressure means takes place, the ring piston 26 is retained by the springs 34, 35 in a position of rest, i.e. a position of equilibrium, which is located between its upper and lower end positions, for example in the middle position represented in FIG. 5. Since in this middle position the ball cage 13 is pushed upwards by the spring 19, the ball elements 14 are pressed against the dome-shaped end section 24 of the ball element clamping sleeve 21, and therefore pressed radially inwards.

If the locking pins 7 are now introduced at the beginning of the docking procedure into such locking units 4, the ball cage 13 and the ball element clamping sleeve 21 can be displaced mutually to some degree in the axial direction due to the elasticity of the spring 19, so that the ball elements 14 are initially pressed outwards, and then, when the circumferential groove 38 of the locking pin 7 is located precisely opposite the ball elements 14, they are pressed back radially inwards again, so that the ball elements 14 come to rest in the circumferential groove 38, as represented in FIG. 5. As a result of this, pre-locking of the locking pins 7 takes place, wherein, however, because of the elasticity of the springs 19, 34, 35, they have a certain axial play. As a result, it is possible, in a particularly simple manner, for all the locking pins 7 to be brought into a provisional locking position and for the test head still to be aligned manually to the handling device.

If pressure means is then introduced into the pressure chamber 28 and drained out of the chamber 33, the ring piston 26 moves downwards and so locks the locking pin 7, as has been described on the basis of the first locking alternative in connection with FIGS. 4 to 6.

Within the framework of the invention a large number of variations are conceivable. For example, it is possible for only one single pressure means line to be provided which is connected to the pressure chamber 28. In this case, the resetting of the ring piston 26 from the locking position shown in FIG. 6 into the release position shown in FIG. 3 can be effected by the force of the springs 34 alone. Embodiments are also conceivable with which no springs 35 are present inside the pressure chamber 28.

The invention claimed is:

1. A docking device for the coupling of a first device including a handler or prober with a second device including a test head for electronic components, with a docking plate which can be secured to one of the devices, at which at least one locking unit is provided, at least one locking pin arranged at the other device, which can be brought into locking engagement with the locking unit allocated to it, the locking unit comprising:
   an axial introduction aperture for the introduction of the locking pin,
   a plurality of ball elements, arranged in the area of the introduction aperture, between which the locking pin can be introduced,
   a ball element clamping sleeve, displaceable in the axial direction, which in a first position allows for a radial position of the ball elements outside the introduction area of the locking pin, in which the locking pin scan be introduced between the ball elements, and in a second position locks the ball elements in a locking position, in which the ball elements project into a circumferential slot of the locking pin which has been introduced,
   wherein the ball element clamping sleeve is surrounded by an annular pressure chamber closed pressure-tight to the introduction area of the locking pin, and can be moved in an axial direction by means of a ring piston, which can be actuated by a pressure means introduced into the pressure chamber,
   wherein the ring piston is engaged by a spring such that, with the pressure chamber in a pressure-less state, the ring piston is retained in a rest position between its axial end positions, and
   wherein in the rest position, the ball elements extend, by pressure contact exerted by the ball element clamping sleeve, into the introduction area of the locking pin.

2. The docking device as claimed in claim 1, wherein the pressure chamber is delimited on one face side by a cover plate of the locking unit and radially inwards by a sleeve element, which surrounds the ball element clamping sleeve co-axially and extends away from the cover plate, and wherein the ball element clamping sleeve has a flange extending radially outwards over the sleeve element, which flange is connected to the ring piston.

3. The docking device as claimed in claim 1, wherein said spring is provided on the side of the ring piston opposite the pressure chamber, said spring exerting an axial spring force on the ring piston, which is directed against the thrust force of the pressure means introduced into the pressure chamber.

4. The docking device as claimed in claim 1, wherein said spring is provided in the pressure chamber, said spring exerting an axial spring force on the ring piston.

* * * * *